United States Patent [19]
Brehmer

[11] Patent Number: 5,446,396
[45] Date of Patent: Aug. 29, 1995

[54] VOLTAGE COMPARATOR WITH HYSTERESIS

[75] Inventor: Geoffrey E. Brehmer, Austin, Tex.

[73] Assignee: Advanced Micro Devices, Inc., Sunnyvale, Calif.

[21] Appl. No.: 964,781

[22] Filed: Oct. 22, 1992

[51] Int. Cl.$^6$ .............................................. H03K 5/24
[52] U.S. Cl. ....................................... 327/66; 327/68
[58] Field of Search ..................... 327/65, 66, 67, 68, 327/70, 72, 73

[56] References Cited

U.S. PATENT DOCUMENTS

| | | | |
|---|---|---|---|
| 4,670,671 | 6/1987 | De Weck | 327/66 |
| 4,717,838 | 1/1988 | Brehmer et al. | 327/66 |
| 4,808,848 | 2/1989 | Miller | 327/66 |
| 4,874,969 | 10/1989 | Meadows | 327/73 |
| 4,940,907 | 7/1990 | Laude | 327/73 |
| 5,117,199 | 5/1992 | Wang et al. | 330/252 |
| 5,289,054 | 2/1994 | Lucas | 327/65 |
| 5,362,994 | 11/1994 | Lin | 327/72 |

FOREIGN PATENT DOCUMENTS

| | | |
|---|---|---|
| 0255172 | 3/1988 | European Pat. Off. |
| 0417334 | 3/1991 | European Pat. Off. |

OTHER PUBLICATIONS von Ulrich, et al., "Erhöhte Genauigkeit bei des Simulation analoger CMOS-Schaltungen durch ein verbessertes MOS-Kompaktmodell," *AEU Archiv fur Elecktronik und Ubertragungstechnik*, 44(1990) Mar./Apr., No. 2, Stugggart, DE.

Nakamura, et al., "An Enhanced Fully Differential Folded-Cascode Op Amp", *IEICE Transactions on Electronics*, No. 4, E75-C (1992) Apr., Tokoyo, JP.

Gopinathan, et al., "Design Considerations for High-Frequency Continuous-Time Filters and Implementation of an Antialiasing Filter for Digital Video", *IEEE*, No. 6, Dec. 25, 1990, New York, USA.

Gray, Paul R., "MOS Operational Amplifier Design—A Tutorial Overview," *I.E.E.E. Jr. of Solid-State Circuits*, vol. SC-17, No. 6, Dec., 1982, pp. 969–982.

*Primary Examiner*—Willis R. Wolfe
*Attorney, Agent, or Firm*—Conley, Rose & Tayon

[57] ABSTRACT

An improved comparator circuit is provided for comparing two input signals and producing a resulting digital output. The comparator circuit uses a single cascode devices and current mirror circuit parallel coupled to two differential amplifier stages. One differential amplifier stage receives differential input signals and the other differential amplifier stage receives a variable reference voltage and a feedback voltage from the output of the comparator. The reference voltage is varied according to user requirements. The reference voltage can be varied to any voltage within the range of the input signals placed on the differential amplifier stage. Hysteresis differential voltage on the input differential amplifier stage can be accurately controlled by varying the biasing current and reference voltage placed on the hysteresis differential amplifier stage.

21 Claims, 4 Drawing Sheets

VOLTAGE COMPARATOR WITH HYSTERESIS

BACKGROUND OF THE INVENTION

1. Field of the Invention

This invention relates to an electronic circuit and more particularly to a comparator circuit for comparing two input signals and producing a resulting output signal.

2. Background of the Relevant Art

A comparator circuit used for comparing two input signals is well known. When operating in its nonlinear range, a comparator provides digital output voltage information corresponding to the difference between the input voltages. For example, if the input voltage placed on the non-inverting input is greater than the voltage placed on the inverting input, then a relatively large output signal may be produced. Conversely, if the input voltage on the non-inverting input is lower than the input voltage on the inverting input, then a relatively low output voltage may be produced. Accordingly, the comparator functions to compare two input signals and produce a digital output based upon that comparison.

Most comparator circuits include at least two stages of operation. For example, typical comparators utilize a differential amplifier or differential transistor pair at the input stage of operation and a plurality of loads/buffers at the output stage. The amplifier and load circuits receive biasing from constant current sources and voltage references generally produced on the same monolithic circuit as that of the comparator. By integrating the reference voltage devices and constant current sources on the same silicon chip as the comparator, fewer package leads are necessary—i.e., power need not be imported off-the-chip. Furthermore, integration ensures matched operation of each component due to fairly uniform process parameters occurring across the substrate surface.

A problem often encountered with many conventional comparators is the detrimental effects of noise upon the input signals feeding the comparator. For example, if one input slightly exceeds the other due to noise, then the output may inadvertently trigger to an opposing digital value. Inadvertent triggering of the output may occur in rapid succession due to rapid and slight fluctuations of the input signal noise. The existence of such fluctuations in the comparator's output caused by input noise is sometimes referred to as "chatter."

In an effort to overcome chatter problems, many comparators utilize a hysteresis feedback loop from the comparator's output to the input amplifier stage. A comparator circuit which uses a feedback hysteresis loop is described in U.S. Pat. No. 4,670,671. Patent '671 describes a comparator circuit having two separate differential amplifiers, wherein one amplifier receives feedback information from the output of the comparator and the other amplifier receives the input signals. The device of Patent '671 ensures that the output will not change unless one input signal exceeds the other input signal by a hysteresis value. Unless the noise peaks on one input exceed the other input by the hysteresis value, the comparator's output will not inadvertently toggle or chatter.

The comparator of Patent '671 is primarily designed to provide hysteresis feedback during high speed operation while using relatively little power. As such, each differential amplifier (feedback and input differential amplifiers) of Patent '671 requires a pair of feedback current mirrors or loads. While these loads provide high speed operation with low power consumption, each load must utilize three transistors interconnected with positive and negative driver circuits. The inclusion of separate loads and drivers adds to the overall complexity of the device by requiring numerous transistors and associated interconnect routing. The additional transistors and routing merely adds to the cost in manufacturing a monolithic device as well as reduces reliability of the device.

SUMMARY OF THE INVENTION

The problems outlined above are in large part solved by the comparator of the present invention. That is, the comparator circuit hereof utilizes a single load circuit instead of numerous loading circuits often found in previous designs. In particular, a single loading circuit provided within a folded cascoded devices and current mirror comprises a portion of a single sinking and sourcing output stage for the device of the present invention. The folded cascode device and current mirror circuit receives parallel input from both a feedback (or hysteresis) differential amplifier and an input (or main) differential amplifier. By connecting each differential amplifier pair of transistors in parallel between constant current devices and the cascoded devices, a single load circuit having relatively few active devices and associated interconnect are needed to provide operation of the present invention. Instead of requiring four separate feedback current mirror loads (each load including three transistors) and two separate drivers (positive and negative drivers) as shown in Patent '671, the present invention merely requires a shared, single current mirror load and a pair of cascode devices.

Broadly speaking, the present invention contemplates an improved comparator circuit having less active devices and associated interconnect. The present comparator thereby occupies less silicon space and is cheaper to manufacture and more reliable to operate. The present comparator includes a pair of current devices and also includes a cascode devices and current mirror circuit coupled to receive a first portion of current from each of the current devices. A pair of differential transistors are coupled to receive the pair of input signals and also to receive a second portion of current from each current device. A pair of hysteresis transistors are coupled in parallel with the differential transistors to receive a third portion of current from each current device. The output voltage produced from the cascode devices and current mirror circuit can be changed in response to changes in the relative magnitudes of the first, second and third portions of current.

The present invention also contemplates a comparator circuit for comparing a pair of input signals. The improved comparator circuit hereof includes first and second current devices, wherein each current device is adapted for producing a constant current equal to the current produced by the other current device. A cascode devices and current mirror circuit is coupled to the first and second current devices such that the cascode devices and current mirror establishes a sinking and sourcing output stage for delivering the comparator's output. First and second conductive paths are coupled between the cascode devices and current mirror circuit and the first and second current devices, respectively. The first conductive path is modulated by the comparator's output and the second conductive path is modulated by a variable reference voltage. Third and fourth conductive paths are coupled in parallel with the first and second conductive paths, respectively. The third conductive path is modulated by one input signal of the pair of input signals and the fourth conductive path is modulated by the other input signal of the pair of input signals. A voltage increase in one input signal to a hysteresis value above the other input signal causes an imbalance in sinking and sourcing currents at the output stage.

The cascode devices and current mirror circuit of the present invention does not require a substantial number of active devices or transistors. Specifically, the cascode devices and current mirror circuit includes first and second cascode transistors having one end of their conductive paths connected to the first and second current devices, respectively. A four transistor current mirror is connected between the cascode transistors and a first power supply, and an output node is connected between the second cascode transistor and two series-connected transistors of the four transistor current mirror.

The present invention further contemplates a method for comparing a pair of input signals. The method includes providing a pair of constant value current devices and drawing a first portion of current from each current device through a cascode devices and current mirror circuit. A second portion of the current is drawn from the current devices through a pair of main differential transistors adapted to receive a pair of input signals. A third portion of current is drawn from each current device through a pair of hysteresis differential transistors coupled to receive a reference voltage and the output voltage from the comparator's output. The output voltage is produced from the sinking and sourcing of current through the cascode devices and current mirror circuit, and the output is then fed back to one input of the hysteresis differential transistor pair. The output voltage changes in response to changes in relative magnitude of the first, second and third portions of current. A digital change in output voltage occurs when the relative magnitude of current portions change during periods in which voltage of one input signal exceeds the voltage of the other input signal by a specific hysteresis amount.

BRIEF DESCRIPTION OF THE DRAWINGS

Other objects and advantages of the invention will become apparent upon reading the following detailed description and upon reference to accompanying drawings in which.

Figure 1:
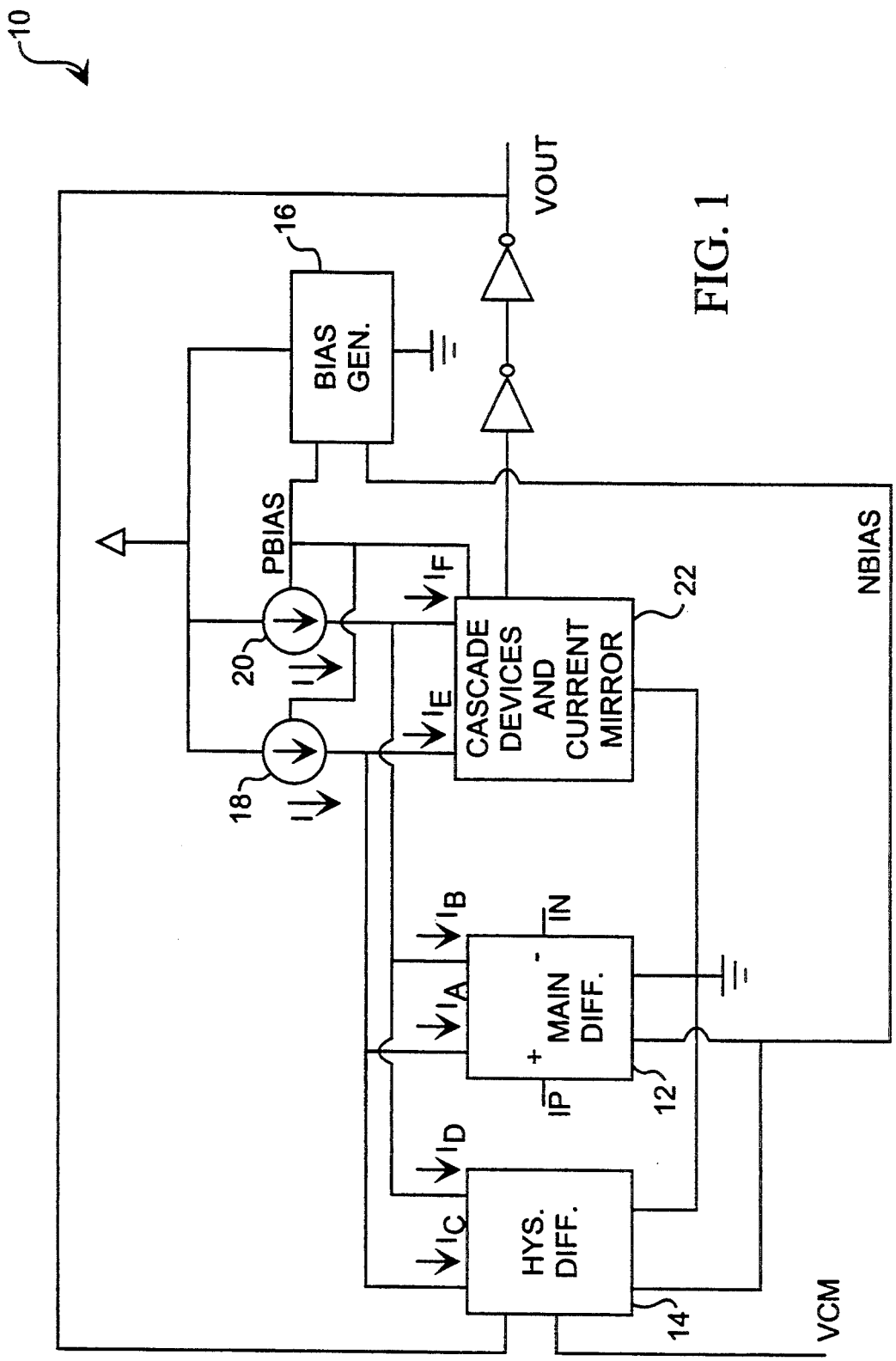
FIG. 1 is a block diagram of a comparator circuit according to the present invention.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates a block diagram of an improved comparator circuit 10 having three stages of operation. The first stage, or main differential amplifier stage 12, is adapted for receiving input signals IP and IN on non-inverting and inverting input terminals as shown. In accordance with standard comparator function, if input signal IP exceeds input signal IN, then a digital "1" or relatively high voltage value may appear on comparator 10 output. A second stage, or hysteresis differential amplifier stage 14, functions to receive output voltage, VOUT, and reference common mode voltage, VCM, and produce an output parallel coupled to the output of main differential stage 12.

Figure 2:
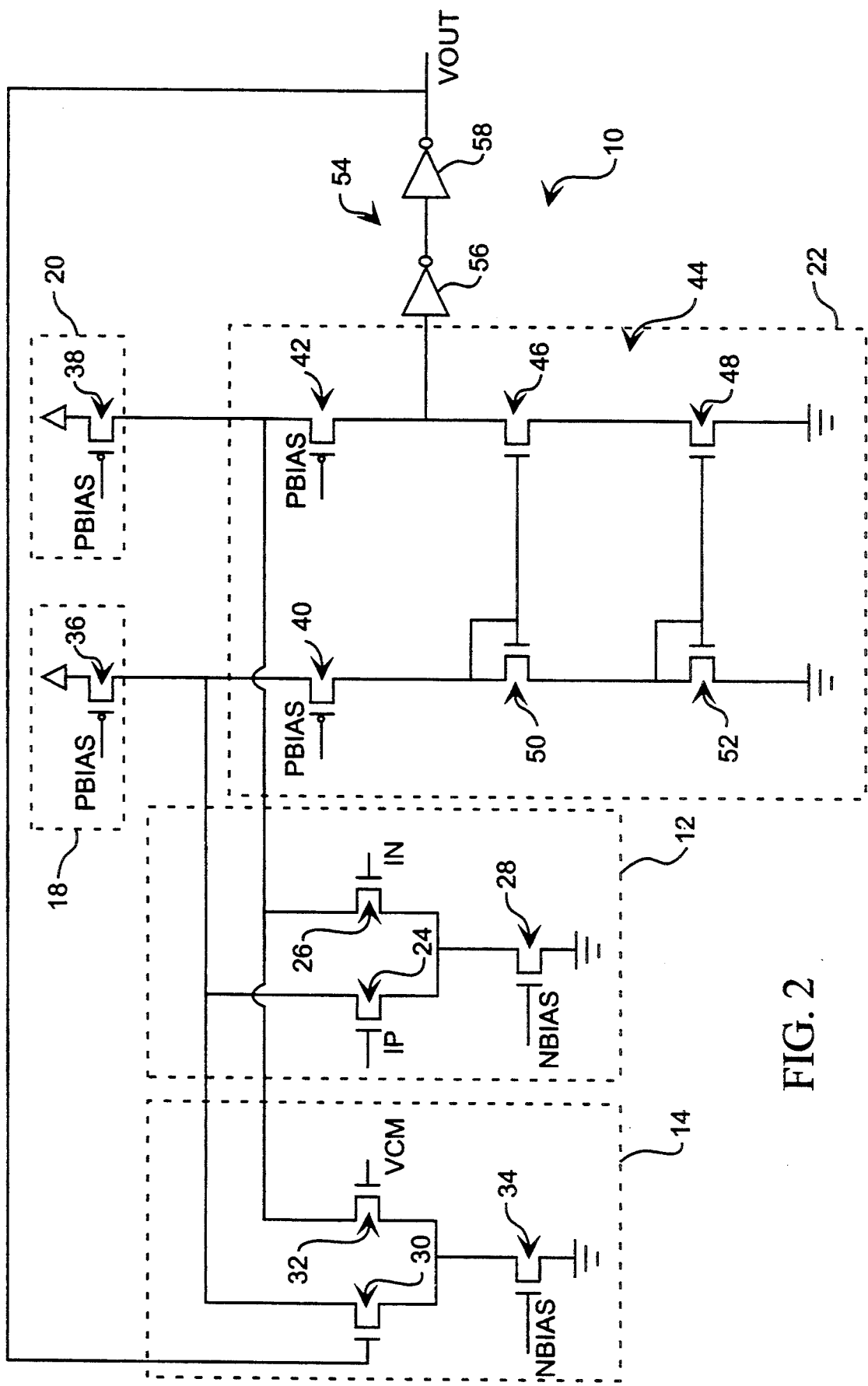
FIG. 2 is a circuit diagram of one embodiment of the comparator Circuit according to the present invention.
Figure 3:
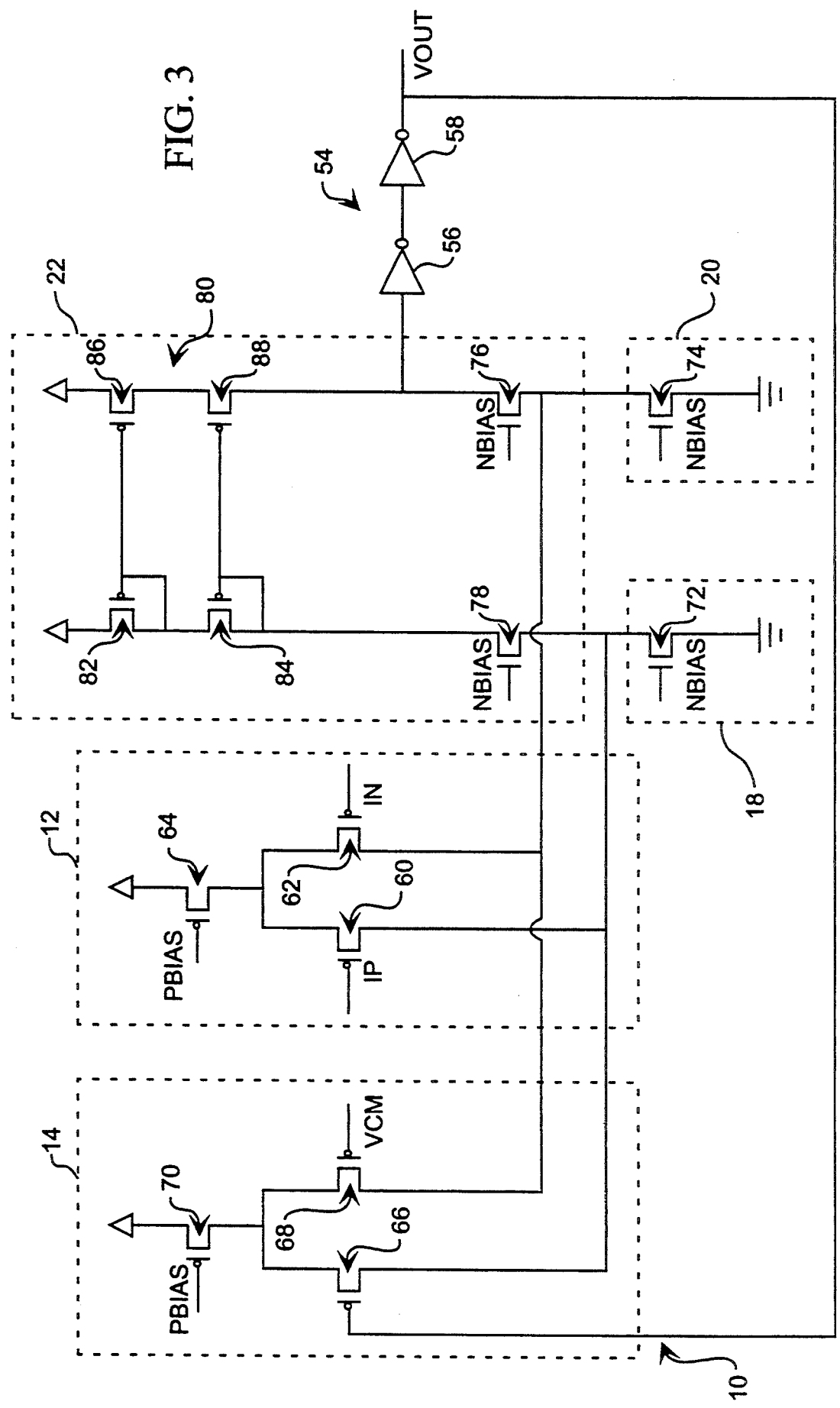
FIG. 3 is a circuit diagram of another embodiment of the comparator circuit according to the present invention.

A voltage bias generator 16 of common design and of well known type is shown capable of establishing bias voltages necessary for biasing constant current devices 18 and 20, stages 14 and 16, and circuit 22. Generator 16 may produce several voltage levels including PBIAS and NBIAS voltages. In addition, each PBIAS and NBIAS single may have two or more distinct voltage levels, wherein one level may bias circuit 22 at a higher or lower voltage level than the level used to bias devices 18 and 20. Furthermore, generator 16 may produce reference voltage VCM or, if desired, reference voltage VCM may be produced from a driver external to comparator circuit 10. Reference voltage NBIAS is suitably used to modulate constant current devices such as n-channel current sinks which may exist in both stages 12 and 14. Conversely, PBIAS is used to modulate constant current devices such as p-channel current sources which, instead of n-channel current sinks, may exist in both stages 12 and 14. Further, depending upon the application, either NBIAS or PBIAS may be used to modulate constant current devices 18 and 20 (which can be either n-channel current sinks as shown in FIG. 3 or as p-channel current sources as shown in FIG. 2). As will be discussed in the various preferred embodiments described below, either current sinks or current sources may be used in stages 12 and 14 or in current devices 18 and 20 depending upon whether the user wishes to configure comparator 10 with predominantly p-channel channel or predominantly n-channel transistor devices. The terms "current devices," as used herein to describe devices 18 and 20, therefore refers to either current sources or current sinks.

A third stage, or cascode devices and current mirror circuit 22, is adapted to receive a portion of the current from current devices 18 and 20. The remaining portion of current is diverted to main differential stage 12 and parallel coupled hysteresis differential stage 14. Depending upon the relative magnitude of input IP versus the magnitude of input IN, varying proportions of current will be channeled through each of the three stages. For example, if IP exceeds IN, then current $I_A$ may be disproportionately larger than current $I_B$. Thus, more of current I from current device 18 will be channeled as $I_A$, leaving less of current I sent through circuit 22 as $I_E$. Conversely, since less current I is sent as $I_B$ into main differential stage 12, more of current I will be sent through circuit 22 as $I_F$. Addition of the hysteresis differential stage 14 sinks further amounts of current from current devices 18 and 20 which might otherwise pass through circuit 22. To ensure adequate amounts of current are sent through circuit 22 in order to transition VOUT, main differential stage 12 must sink additional amounts of current to overcome the additional sink through hysteresis stage 14. The additional amount of current being sunk through stage 12 is caused by an additional hysteresis differential voltage placed on the input signals beyond the equilibrium voltage level.

Referring to FIG. 2, a circuit diagram of one embodiment of comparator circuit 10 is shown according to the present invention. The circuit diagram illustrates in more detail the block diagram of FIG. 1 having predominantly n-channel transistors instead of p-channel transistors. In particular, each stage 12, 14 and 22 of comparator 10 is shown having a limited number of active devices and related interconnect. Main differential stage 12 is shown comprising a pair of differential transistors 24 and 26, each transistor having a conductive path with one end of their conductive paths coupled to another conductive path formed by current sink transistor 28. An NBIAS voltage exceeding a first power supply, such as ground, by a threshold amount will cause current to sink to a first power supply from conductive paths formed by differential transistors 24 and 26.

Coupled in parallel with differential transistors 24 and 26 and with current sink transistor 28 are hysteresis transistors 30 and 32 as well as current sink transistor 34. Each of first and second current devices 18 and 20 are shown in FIG. 2 as utilizing a single current source transistor. Current source transistor 36 and 38 are activated to provide constant current from current devices 18 and 20, respectively. The current amounts produced by current device 18 and 20 are equal to one another due to an equal PBIAS voltages placed on the gates of each transistor 36 and 38. PBIAS voltage modulates a constant current flowing from a second power supply such as a positive power supply (i.e., VDD).

Cascode devices and current mirror circuit 22 includes two cascode transistors 40 and 42 connected in series with transistors 36 and 38 thereby establishing a sinking and sourcing configuration. Primarily, sinking and sourcing occurs at the common drain node of one cascode transistor (i.e., transistor 42) and one transistor (i.e., transistor 46) of the current mirror load 44. Connected between a first power supply and cascode transistors 40 and 42 is the four-transistor current mirror load 44. Current mirror 44 includes two transistors 46 and 48 connected in series between first power supply and transistor 42. Another series-connected pair of transistors 50 and 52 are connected between first power supply and transistor 40. A buffer circuit 54, which includes two inverters 56 and 58, may be utilized to buffer output voltage, VOUT, from circuit 22. Buffer 54, however, is not necessary in many applications. Regardless of whether buffer 54 is used, VOUT is fed back to the gate of transistor 30 of hysteresis transistor pairs 30 and 32.

Transistors found throughout comparator 10 may be either field effect transistors (FET) or bipolar transistors. Preferably, the transistors are fabricated with MOSFET technology with both p-channel and n-channel devices. While CMOS design is preferred, other transistor technology may be used. For exemplary purposes only, CMOS design is chosen and indicated in FIG. 2 as having p-channel and n-channel enhancement field effect transistors. As generally known to those of skill in the art, enhancement transistors conduct with an applied gate-to-source voltage exceeds a threshold amount. It is important to note, however, that one or more enhancement transistors may be replaced by depletions transistors providing the same purpose and function is maintained as described herein by the present invention. P-channel transistors are illustrated as having a small circle placed at the gate terminal, whereas n-channel transistors are shown not having such as circle placed at the gate. It is well known that the source terminal of the source-drain conductive path is that terminal placed closest to the power supply. For a p-channel device, the source terminal is connected closer to the second power supply (e.g., VDD) than the drain terminal. In addition the source terminal of the n-channel devices are placed closer to the first power supply (e.g., ground) than the drain terminal.

Comparator 10 operates by taking into account the previous output of the comparator. If IP exceeds IN, then more current will be sent through transistor 24 than through transistor 26. A resulting larger current will thus appear through transistor 42 than through transistor 40. Lesser current through transistor 40 will be mirrored through transistors 50 and 52 as well as transistors 46 and 48. The small current through transistors 46 and 48 (smaller relative to the current through transistor 42) will present a current imbalance at the drain terminal of transistors 42 and 46. The current imbalance will cause a relatively high digital output corresponding to input IP being greater than input IN.

If VOUT is at a relatively high voltage level, transistor 30 is brought within saturation causing a greater sinking of current through transistor 30 than through transistor 32. Transistor 30 provides current sink in addition to the current sink through transistor 24 to thereby ensure an additional current imbalance at the drains of transistors 42 and 46. The additional current drain thus provides a hysteresis level by which input IP must decrease beyond input IN before VOUT toggles from its relatively high voltage state to a relatively low voltage state. If VOUT is to toggle or transition from a high level to a low level, IN must be sufficiently higher than IP to cause transistor 26 to sink enough current to overcome the current sinks through transistors 24 and 30. Thus, input signal IP must be at a threshold level (hysteresis level) below IN, or input signal IN must be at a threshold level (hysteresis level) above IP to cause VOUT to transition from its previous high voltage state to a low voltage state.

The amount of hysteresis voltage can be adjusted by varying the bias current within transistor 34 of hysteresis differential pair 14. If bias current within transistor 34 increases, then hysteresis voltage may also increase. Likewise, if bias current decreases, then hysteresis voltage will decrease. This allows for a well-controlled hysteresis voltage within the comparator 10. "Hysteresis width" is defined as the difference in voltage between IP and IN which causes VOUT to transition; whereas "hysteresis position" is defined as the voltage point in which transition occurs relative to the input voltages placed on the main differential amplifier stage 12. Hysteresis width can be varied by changing the bias current through the sinking transistor 34 (see FIG. 2) or the sourcing transistor 70 (see FIG. 3). In addition, hysteresis point can be varied by changing the relative magnitude of VCM within the input differential range of main differential pair 12.

Referring to FIG. 3, an alternative embodiment of comparator 10 is shown which can achieve the same result as the comparator shown in FIG. 2. Instead of using predominantly n-channel devices, as shown in FIG. 2, the embodiment of FIG. 3 uses primarily p-channel devices. In particular, main differential amplifier stage 12 is shown using two p-channel differential transistor pairs 60 and 62 coupled in series with a p-channel current source transistor 64. Coupled in parallel with stage 12 is hysteresis differential stage 14 having p-channel hysteresis transistor pairs 66 and 68. Transistor pairs 66 and 68 are coupled in series with p-channel current source transistor 70.

Shown in FIG. 3 are parallel coupled stages 12 and 14 connected between current devices 18 and 20 and cascode devices and current mirror circuit 22 similar to the predominantly n-channel layout of FIG. 2. Each current device 18 and 20 utilizes a single n-channel current sink transistor denoted as 72 and 74. Transistor 72 and 74 sink varying proportions of current from stage 12, stage 14 and circuit 22 depending upon the relative voltage differential upon input signal IP and IN. Circuit 22 produces VOUT and retains the VOUT state unless the differential voltage between IP and IN exceeds a hysteresis value. VOUT changes or transitions in response to relative changes in the magnitude of first, second and third portions of current received through circuit 22, differential stage 12 and hysteresis stage 14, respectively. Unless one input exceeds the other by the hysteresis value, a current imbalance will not result at the drains of transistors 88 and 76, henceforth not creating a VOUT transition. The pair of cascode devices 76 and 78 are connected in series between current devices 18 and 20, respectively, and p-channel current mirror 80. Current mirror 80 comprises four p-channel transistors 82, 84, 86, and 88. Sinking and sourcing occurs at the common drains of transistors 88 and 76 shown in FIG. 3.

The embodiment illustrated in FIG. 3 operates similar to that shown in FIG. 2. Namely, VOUT is fed back to the hysteresis stage thereby providing subsequent transitions of output if hysteresis differential input voltage occurs. Instead of sinking current from current source transistors as in the embodiment of FIG. 2, stages 12 and 14 and circuit 22 (shown in FIG. 3), source current to current sink transistors 72 and 74 in relative proportion to the input signal differential and the present state of VOUT.

Figure 4:
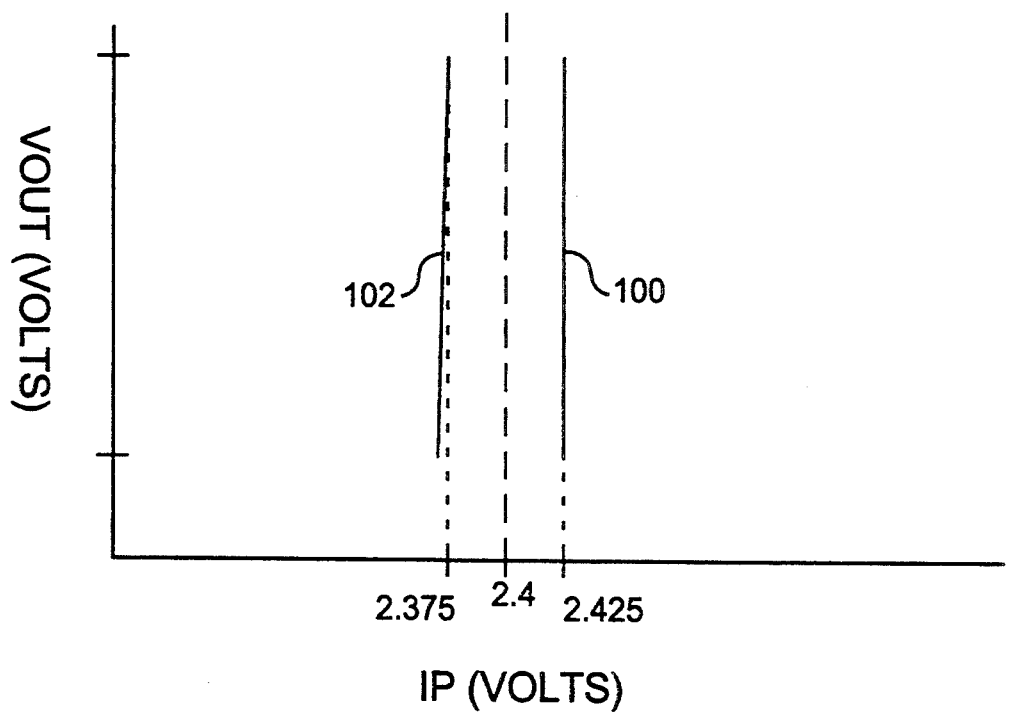
FIG. 4 is a graph illustrating hysteresis width as a function of input voltage versus output voltage according to the present invention.

Referring to FIG. 4, simulation results are illustrated for comparator 10 of the present invention. During simulation, voltage reference VCM was fixed at a constant voltage of 2.4 volts and first and second power supplies were set at ground and 5.0 volts, respectively. Input signal IN was also set at 2.4 volts and the voltage of input signal IP was varied about VCM. FIG. 4 illustrates the width of hysteresis at the exemplary VCM and input voltages chosen for simulation. As shown by curve 100, when IP exceeds IN by approximately 25 millivolts (mv), VOUT will begin its transition from a relatively low voltage value to a relative high voltage value (e.g., from 0 volts to 5 volts). Curve 100 is shown as a steep line indicating rapid output slew rate, a preferred design outcome. Additionally, curve 102 indicates that VOUT will remain at 5 volts even after IP decreases slightly below IN. However, once IP becomes 25 mv less than IN, then VOUT begins its transition from 5 volts to 0 volts as shown.

Figure 5:
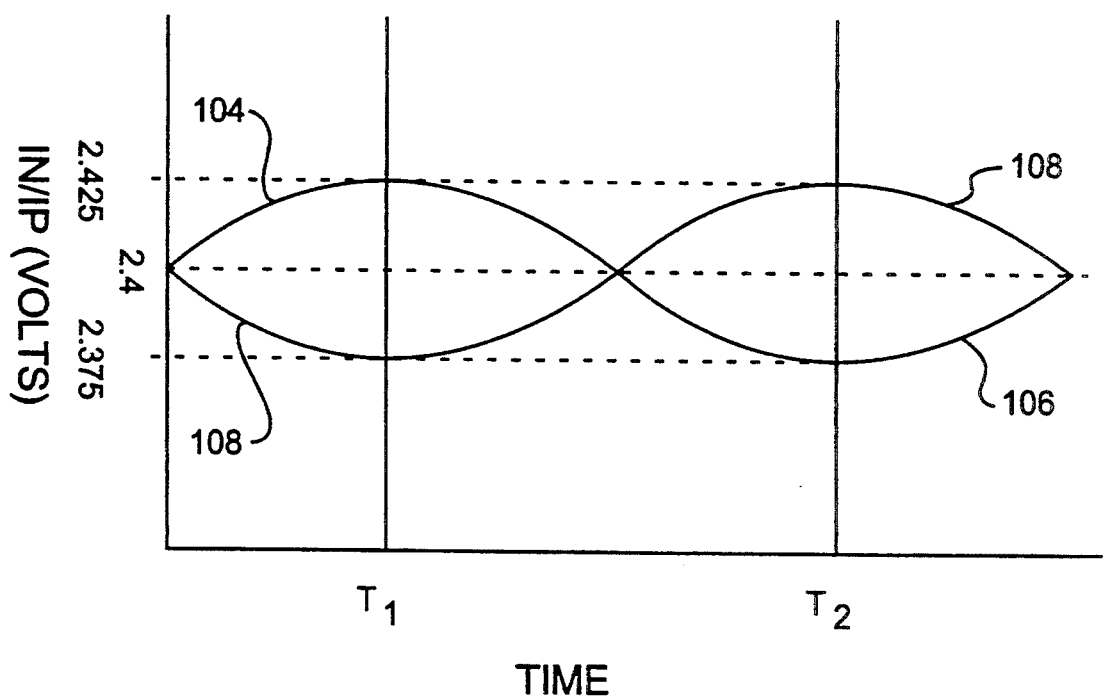
FIG. 5 is a graph illustrating transient analysis of hysteresis trip points as a function of input voltage about a reference voltage (VCM) according to the present invention.

Referring to FIG. 5, a transient analysis of VOUT trip points is shown. As IP increases 25 mv above IN as shown by curve 104, then VOUT transitions to a high level at time $T_1$. Following the transient sinusoidal curve, a reverse bias of signal IP below IN, as shown by curve 106, will cause VOUT to transition to a low level at time $T_2$. Conversely, curve 108 indicates the opposite result occurring when input signal IN initially skews below input signal IP and then reverses and skews greater than input signal IP. Transient analysis demonstrates rapid response of output slew rate once differential input voltages exceed the hysteresis value, e.g., 25 mv. If differential input signals fluctuate (possible due to noise) less than the hysteresis level of 25 mv, then VOUT will not transition and will not produce undesirable chatter signals.

It will be appreciated to those skilled in the art having the benefit of this disclosure that this invention is believed to be capable of applications with numerous types of transistors, either bipolar or MOS, either predominantly p-channel or n-channel, or either predominantly enhancement or depletion type. Furthermore, it also to be understood that the form of the invention shown and described is to be taken as a presently preferred embodiment. Various modifications and changes may be made without departing from the spirit and scope of the invention as set forth in the claim. An exemplary modification might be one which uses current sources as opposed to current sinks in each stage of the comparator. Moreover, current sinks may be used instead of current sources for each of the constant current devices. Even still further, a buffer circuit may or may not be used depending upon the user requirements and specific output applications. It is intended that the following claims be interpreted to embrace all such modifications and changes.

What is claimed is:

1. A comparator circuit comprising:
   a pair of current devices;
   cascode devices and current mirror circuit coupled to receive a first portion of current from each said current device;
   a pair of differential transistors coupled to receive a pair of input signals and to receive a second portion of current from each said current device;
   a pair of hysteresis transistors coupled in parallel with said differential transistors to receive a third portion of current from each said current device; and
   means for changing an output voltage produced from said cascode devices and current mirror circuit in response to changes in the relative magnitudes of said first, said second, and said third portions of current.

2. The comparator circuit as recited in claim 1, wherein said current devices produce a current amount equal to the sum of said first, second and third portions of said current.

3. The comparator circuit as recited in claim 1, wherein said pair of differential transistors and said pair of hysteresis transistors are coupled between said current devices and said cascode devices and current mirror circuit.

4. The comparator circuit as recited in claim 1, wherein said output voltage is coupled to one input of said pair of hysteresis transistors, said other input of said pair of hysteresis transistors is coupled to receive a reference voltage.

5. A comparator circuit for comparing a pair of input signals, comprising:
   first and second current devices, each said current device is adapted for producing a constant current equal to the current produced by the other current device;
   a single cascode devices and current mirror circuit having two sinking and sourcing current paths and an output connected to one of said current paths;
   first and second conductive paths coupled between said cascode devices and current mirror circuit and said first and second current devices, respectively, wherein said first conductive path is modulated by a signal sent from said output and said second conductive path is modulated by a variable reference voltage;
   third and fourth conductive paths coupled in parallel with said first and second conductive paths, wherein said third conductive path is modulated by one input signal of said pair of input signals and said fourth conductive path is modulated by the other input signal of said pair of input signals; and
   means for increasing the voltage of one input signal of said pair of input signals to a hysteresis value above the other input signal of said pair of input signals and for causing a current imbalance in said current paths.

6. The comparator circuit as recited in claim 5, wherein said first and second conductive paths comprise the conductive paths of a pair of hysteresis transistors connected between said current devices and a current sink coupled to a first power supply.

7. The comparator circuit as recited in claim 6, wherein said first power supply is ground.

8. The comparator circuit as recited in claim 5, wherein said first and second conductive paths comprise the conductive paths of a pair of hysteresis transistors connected between said current devices and a current source coupled to a second power supply.

9. The comparator circuit as recited in claim 8, wherein said second power supply is a positive voltage.

10. The comparator circuit as recited in claim 5, wherein said third and fourth conductive paths comprise the conductive paths of a pair of differential transistors connected between said current devices and a current sink coupled to a first power supply.

11. The comparator circuit as recited in claim 10, wherein said first power supply is ground.

12. The comparator circuit as recited in claim 5, wherein said third and fourth conductive paths comprise the conductive paths of a pair of differential transistors connected between said current devices and a current source coupled to a second power supply.

13. The comparator circuit as recited in claim 12, wherein said second power supply is a positive voltage.

14. The comparator circuit as recited in claim 5, wherein each said first and second current device comprises a transistor modulated by a constant biasing voltage sent from a bias generator.

15. The comparator circuit as recited in claim 5, wherein said cascode devices and current mirror circuit comprises:

first and second cascode transistors having one end of their conductive paths connected to said first and second current devices, respectively;
   a four transistor current mirror connected between said loading transistors and a first power supply; and
   said output connected between said second cascode transistor and two series connected transistors of said current mirror.

16. The comparator circuit as recited in claim 15, wherein said cascode devices and current mirror circuit further comprising means for modulating said first and second cascode transistors with a constant biasing voltage sent from a bias generator.

17. The comparator circuit as recited in claim 5, further comprising a buffer circuit placed between said output and said cascode devices and current mirror circuit.

18. A comparator circuit for comparing a pair of input signals, comprising:
   first and second current devices, each said current device is adapted for producing a constant current equal to the current produced by the other current device;
   a cascode devices and current mirror circuit placed between said first and second current devices and a first power supply, said cascode devices and current mirror circuit comprising:
      first and second cascode transistors, each cascode transistor having a conductive path with one end of each said conductive path connected to said first and second current devices, respectively;
      a four transistor current mirror connected between said cascode transistors and a second power supply; and
      an output connected between said second loading transistor and two series connected transistors of said current mirror;
   first and second conductive paths coupled between said cascode devices and current mirror circuit and said first and second current devices, respectively, wherein said first conductive path is modulated by said output and said second conductive path is modulated by a variable reference voltage;
   third and fourth conductive paths coupled in parallel with said first and second conductive paths, wherein said third conductive path is modulated by one input signal of said pair of input signals and said fourth conductive path is modulated the other input signal of said pair of input signals; and
   means for increasing the voltage of one input signal of said pair of input signals to a hysteresis value above the other input signal of said pair of input signals and for causing a current imbalance between the first and second cascode transistors.

19. A method for comparing a pair of input signals, comprising the steps of:
   providing a pair of constant value current devices;
   drawing a first portion of current from each said current device through a cascode devices and current mirror circuit;
   drawing a second portion of said current from each said current device through a pair of differential transistors coupled to receive said pair of input signals;
   drawing a third portion of said current from each said current device through a pair of hysteresis transistors coupled to receive a reference voltage and an output voltage; and producing said output voltage from said cascode devices and current mirror circuit in response to changes in the relative magnitudes of said first, second and third portions of current.

20. The method as recited in claim 19, wherein said producing step comprises increasing the voltage of one input signal of said pair of input signals to a hysteresis value above the other input signal of said pair of input signals.

21. The method as recited in claim 19, wherein said producing step comprises decreasing the voltage of one input signal of said pair of input signals to a hysteresis value below the other input signal of said pair of input signals.

* * * * *